US010229863B2

(12) United States Patent
Lorz et al.

(10) Patent No.: US 10,229,863 B2
(45) Date of Patent: Mar. 12, 2019

(54) PHASE MODULE FOR A POWER CONVERTER

(71) Applicant: Siemens Aktiengesellschaft, München (DE)

(72) Inventors: Roland Lorz, Röttenbach (DE); Rainer Sommer, Heroldsbach (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 15/740,283

(22) PCT Filed: Jul. 6, 2016

(86) PCT No.: PCT/EP2016/065913
§ 371 (c)(1),
(2) Date: Dec. 27, 2017

(87) PCT Pub. No.: WO2017/029020
PCT Pub. Date: Feb. 23, 2017

(65) Prior Publication Data
US 2018/0190567 A1    Jul. 5, 2018

(30) Foreign Application Priority Data
Aug. 14, 2015  (EP) ..................................... 15181114

(51) Int. Cl.
*H01L 23/10*    (2006.01)
*H01L 23/34*    (2006.01)
(Continued)

(52) U.S. Cl.
CPC .......... *H01L 23/3735* (2013.01); *H01L 23/36* (2013.01); *H01L 24/32* (2013.01);
(Continued)

(58) Field of Classification Search
CPC ..... H01L 24/32; H01L 23/36; H01L 23/3725; H02M 7/003; H02M 7/493; H05K 7/209
(Continued)

(56) References Cited

U.S. PATENT DOCUMENTS 7,924,585 B2   4/2011  Sommer
8,138,632 B2   3/2012  Sommer et al.
(Continued)

FOREIGN PATENT DOCUMENTS

DE    41 43 346 A1    11/1992
EP    0 569 221 A2    11/1993
(Continued)

OTHER PUBLICATIONS

PCT International Search Report and Written Opinion of International Searching Authority dated Oct. 13, 2016 corresponding to PCT International Application No. PCT/EP2016/065913 filed Jul. 6, 2016.

*Primary Examiner* — David S Blum
(74) *Attorney, Agent, or Firm* — Henry M. Feiereisen LLC

(57) ABSTRACT

The invention relates to a phase module (1) for a power converter (2) comprising at least one switching element (10) and a heatsink (13). In order to improve the cooling properties of a phase module (1), it is proposed that the switching element (10) is connected to the heatsink (13), wherein the connection between switching element (10) and heatsink (13) is a non-detachable connection. The invention further relates to a power converter (2) comprising at least one phase module (1) of this type and a method for producing a phase module (1) of this type, wherein in order to produce a connection between the switching element (10) and the heatsink (13), the switching element (10) is soldered, sintered or glued onto the heatsink (13).

5 Claims, 5 Drawing Sheets

(51) Int. Cl.
  *H01L 21/44*    (2006.01)
  *H01L 21/48*    (2006.01)
  *H01L 21/50*    (2006.01)
  *H01L 23/373*   (2006.01)
  *H01L 23/36*    (2006.01)
  *H02M 7/00*     (2006.01)
  *H02M 7/493*    (2007.01)
  *H05K 7/20*     (2006.01)
  *H01L 23/00*    (2006.01)
  *H02M 1/00*     (2006.01)
  *H02M 1/32*     (2007.01)

(52) U.S. Cl.
  CPC ........... *H02M 7/003* (2013.01); *H02M 7/493* (2013.01); *H05K 7/209* (2013.01); *H01L 2224/32225* (2013.01); *H02M 2001/0009* (2013.01); *H02M 2001/327* (2013.01)

(58) Field of Classification Search
  USPC .......................................... 257/707; 438/122
  See application file for complete search history.

(56) References Cited

U.S. PATENT DOCUMENTS

| | | | |
|---|---|---|---|
| 8,476,854 B2 | 7/2013 | Blöcher et al. | |
| 8,766,480 B2 | 7/2014 | Hiller et al. | |
| 8,786,450 B2 | 7/2014 | Dietrich et al. | |
| 8,873,258 B2 | 10/2014 | Hiller et al. | |
| 8,994,438 B2 | 3/2015 | Gediga et al. | |
| 9,088,229 B2 | 7/2015 | Brunotte et al. | |
| 2006/0284211 A1 | 12/2006 | Takubo | |
| 2008/0232145 A1 | 9/2008 | Hiller et al. | |
| 2008/0259661 A1 | 10/2008 | Hiller et al. | |
| 2011/0049994 A1 | 3/2011 | Hiller et al. | |
| 2011/0089873 A1 | 4/2011 | Blöcher et al. | |
| 2011/0235276 A1 | 9/2011 | Hentschel et al. | |
| 2012/0014059 A1 | 1/2012 | Zeng | |
| 2012/0105235 A1 | 5/2012 | Dietrich et al. | |
| 2012/0147636 A1 | 6/2012 | Hiller et al. | |
| 2012/0218710 A1 | 8/2012 | Ioannidis | |
| 2013/0300380 A1 | 11/2013 | Brunotte et al. | |
| 2014/0145779 A1 | 5/2014 | Gediga et al. | |
| 2015/0173248 A1* | 6/2015 | Zeng | H05K 7/1432 361/709 |
| 2018/0122782 A1* | 5/2018 | Weidner | H01L 25/072 |

FOREIGN PATENT DOCUMENTS

| | | |
|---|---|---|
| EP | 1 387 609 A2 | 2/2004 |
| RU | 2514734 C2 | 5/2014 |

\* cited by examiner

PHASE MODULE FOR A POWER CONVERTER

CROSS-REFERENCES TO RELATED APPLICATIONS

This application is the U.S. National Stage of International Application No. PCT/EP2016/065913, filed Jul. 6, 2016, which designated the United States and has been published as International Publication No. WO 2017/029020 and which claims the priority of European Patent Application, Serial No. 15181114.8, filed Aug. 14, 2015, pursuant to 35 U.S.C. 119(a)-(d).

BACKGROUND OF THE INVENTION

The invention relates to a phase module for a power converter having at least one switching element and a heat sink. The invention further relates to a power converter with at least one phase module of this type and also to a method for producing a phase module of this type.

Power converters are used to supply electrical machines or electrical networks with electrical energy. The machine is able to be controlled and regulated with the aid of the power converter. Over and above this power converters are used for the low-loss transmission of energy. A further area of application for power converters is represented by compensators. These allow reactive power and/or current harmonics to be compensated for, i.e. eliminated, or explicitly injected into a network.

For constructing a power converter the required switching elements, which have semiconductors, are mounted on heat sinks. The switching elements in such cases are available on the market as modules with different performance. For a good heat transfer, i.e. for a good cooling of the switching element, thermally conductive paste is applied to the contact surface before installation, in order to achieve the best possible heat transfer by eliminating air pockets.

In such cases a number of switching elements are often installed on one heat sink. The heat sink, in this case far heavier than the weight of the individual switching modules in respect of its weight, as well as the function of cooling, simultaneously has the function of holding the modules in the power converter or fastening them to it. Forces, such as the force due to weight or forces caused by movement, such as for example by vibrations, will be taken up by the heat sink.

To produce power converters with different power, modules with different performance are installed. These differ in their size and to some extent in their form, so that different heat sinks are also used for different power classes. Likewise it is usual to arrange a number of modules in parallel. The disadvantage here however is that, because of variations in the product characteristics, the current is not distributed evenly to the modules. This means that optimal use is not made of their performance by the modules. This leads to high costs with only a slight increase in the performance. Although the parallel connection of power converters enables different power ranges to be covered, these are associated with high costs however.

SUMMARY OF THE INVENTION

The underlying object of the invention is to improve a phase module for a power converter in respect of its cooling.

This object is achieved by a phase module for a power converter with at least one switching element and a heat sink, wherein the switching element is connected to the heat sink, wherein the connection between switching element and heat sink is a non-detachable connection. The object is further achieved by a power converter with at least one phase module of this type. The object is further achieved by a method for producing a phase module of this type, wherein, in order to produce a connection between the switching element and the heat sink, the switching element is soldered, sintered or glued onto the heat sink.

Further advantageous embodiments of the invention are specified in the dependent claims.

The invention is based on the knowledge that a phase module is able to be improved by the switching element being connected to the heat sink in a non-detachable manner. Soldering, sintering or gluing represents a non-detachable connection for example. Although it is technically possible to release this connection, further steps, in some cases quite expensive steps, are required in order to re-establish the connection. In some cases the release of the connection can lead to permanent damage to heat sink and/or switching element.

It has proved especially advantageous that an especially good heat transfer from switching element to heat sink is able to be produced by this non-detachable connection. Satisfactory cooling results can thus already be produced with relatively small and thereby lightweight heat sinks.

In such cases all types of heat sinks can be used. In particular the use of the cooling media air or liquid, such as water for example, has proved to be advantageous. Likewise a cooling in which the heat sink has heat pipes has proved to be advantageous. For liquid cooling the further interface for the coolant circuit is also to be considered. This can be realized via the support frame or the support plate. As an alternative the half bridge modules can be configured directly to stacks (screwing together, clamping, pressing, such as in the water conveyance system for example).

It has proved especially advantageous to provide precisely one heat sink for the switching element or the switching elements of a phase module. To put it another way, only the switching element or the switching elements of one phase module will be connected to the heat sink in each case. The good heat transfer and the task of cooling down just one phase module enables the heat sink to be designed especially small and lightweight. The ratio of weight of the heat sink or the phase module to overall weight of the phase module is relatively small. The weight of the heat sink often amounts in such cases to less than 50% of the weight of the overall phase module including heat sink.

It has proved especially advantageous to provide the non-detachable connection between switching element and heat sink for switching elements with a cut-off voltage ranging from 1200V to 1700V. It has been shown that the advantages of the good heat transfer and of the small and lightweight heat sinks associated therewith overcome the disadvantages given below. The disadvantages that should be mentioned include that, by comparison with applications outside power electronics, such as microelectronics for example, there is likely to be a higher level of scrap in the production of the non-detachable connection. In applications outside power electronics the solder surface is very small. This enables an even heating of the connecting surface to be ensured, so that the connection is able to be produced easily.

In the area of power electronics, especially with power semiconductors with a cut-off voltage ranging from 1200V to 1700V as well as beyond this range, the contact surface is large. It must be ensured here that this surface is warmed up or heated up evenly. Since this is difficult to achieve and if necessary to monitor, there is likely to be a higher level of scrap in the production of the non-detachable connection. When soldering or sintering switching elements with a cut-off voltage in the range of 1200V to 1700V there must be an even heating-up over the contact surface both of the switching element and also of the heat sink. Even small deviations can lead to mechanical stresses in the connection, which leads to a loss of the adhesion effect in the connection or at least worsens the heat transfer between switching element and heat sink such that, in relation to thermal conductivity, this no longer delivers any advantages compared to a screw connection between switching element and heat sink known from the prior art. A non-optimal connection between switching element and heat sink in the manufacturing process is not able to be corrected or at least is only able to be corrected with a high technical outlay, which calls into question the cost-effectiveness of this phase module.

Thus the fault-free production of the non-detachable connection for power semiconductors, in particular with a cut-off voltage in the range of 1200V to 1700V and beyond said range, is only able to be done with difficulty.

The non-detachable connection, as well as the good heat conductivity, which is important for operation at high power or high currents, has the advantage moreover of a greater resistance to changing loads. A fluctuating load, also called a changing load, with screw connections, which are used nowadays between heat sink and switching element with a cut-off voltage in the range of 1200V and 1700V, leads to greatly differing expansions because of different temperature coefficients of the materials of heat sink and switching element. These are compensated for by the heat-conducting paste. The heat-conducting paste is mechanically stressed thereby, since said paste is subject to a rolling-out process. On the one hand this leads to the heat-transfer paste being forced out of the contact surface. Moreover this leads to a reduction in the service life, which even manifests itself in some cases in a marked reduction in the thermal conductivity.

Observations about resistance to changing load are of no interest outside power electronics. Since fluctuating loads do not lead to large temperature differences in such applications, these do not have any limiting influence on the lifetime of the semiconductors and therefore will not be taken into account there in the design and manufacturing of semiconductors.

Over and above this, with the phase module the heat sink is so small and light that it has a low thermal capacitance. This in its turn brings about a far lower temperature difference between switching element and heat sink. The result of this is an even lower sensitivity in relation to a fluctuating load and leads to a high changing load capability of the phase module.

It has proved especially advantageous to use switching elements with a cut-off voltage in the range of 1200V to 1700V and low current-carrying capacity for the phase module with non-detachable connection. This low current-carrying capacity lies in the range of 100 A to 200 A. Here the ratio of weight of the heat sink to overall weight of the phase module is especially favorable, since only relatively little power loss occurs in the switching module, which has to be cooled. Three-phase power converters, in particular 2-point power converters, can be assembled in a simple manner with these phase modules, which have a power in the range of 70 kW to 100 kW. Thus a power of around 20 kW to 35 kW is produced per phase. In this case, in an advantageous embodiment, a phase can be realized through the phase module when this phase module is constructed as a half bridge with two switching elements.

Through the individual phase modules, for example three phase modules for a three-phase power converter, there is flexibility in the arrangement of these phase modules, since the individual switching elements are not all arranged on one heat sink. The individual phase modules can be arranged practically independently of one another in the power converter. Thus for example air channels for the cooling air can be dimensioned especially small. The space requirement of the phase modules is thus correspondingly small. Through the lower weight the installation within the power converter is also far easier than with large and thereby heavier heat sinks, since expensive support structures can be dispensed with.

Over and above this it has proved advantageous to integrate snubber capacitors for fast commutation, in particular for wide band gap semiconductors, into the phase module. The integration of the additional components is preferably done on the same substrate as the switching element and without any separate component housing (at chip level). It is likewise advantageous to use the same contacting technology as for the power semiconductors.

An increase in the performance of a phase of the power converter and thus an increase in the performance of overall power converter can be obtained in a simple manner by the parallel connection of a number of phase modules. Thus for example, in the three-phase, 2-point power converter mentioned above, by connecting two phase modules in parallel into the phase, a power of the power converter of 140 kW to 200 kW in total can be obtained. Thus a highly-integrated, low-variant module concept in respect of modularity, parallel connection and granularity is available with the phase module.

The parallel connection of phase modules enables power converters in the power range of 70 kW to 1 MW to be assembled in a modular design in a simple manner by using a corresponding number of phase modules.

In an advantageous embodiment of the invention the phase module has at least one electrical terminal, wherein the phase module is able to be fastened by means of the electrical terminal. Through the modular and scalable approach the phase module, including heat sink, forms a very compact structure. This structure is suitable, because of its small size and low weight, for fastening by means of the electrical terminal. A busbar configuration is suitable for this purpose in an especially advantageous manner, which is usually provided for switching elements with cut-off voltages in the range of 1200V to 1700V and beyond, for low-induction connection with the capacitors of the DC link circuit. The cross-section of this busbar is produced from the current loading and thereby from the performance of the phase module or of the power converter constructed from the phase module. It has been shown that precisely by the described weight reduction in the heat sink, because of the non-detachable connection of switching element and heat sink, the forces for fastening into the power converter are low enough for said forces to be accommodated by the busbar and the corresponding attachment element between busbar and electrical terminal of the phase module, such as for example a screw or a clamping spring. An additional mechanical fixing of the phase module can thus be dispensed with. If an additional mechanical fixing/fastening is not to be dispensed with or if this is desired or prescribed, this can at least be designed small enough for it only to have to exert a small proportion of the force for fastening the phase module. The proportion of the force then to be taken up by the additional mechanical fastening is smaller than the force taken up via the electrical terminals. The mechanical layout of the power converter is thus simplified significantly by the use of the phase module. This leads to a further weight reduction and also to a cost reduction of the power converter constructed with the phase modules.

As an alternative or in addition the phase module can also be pushed into a holder, also referred to as a retaining plate, in the form of a template. Because of the low weight of the phase module and or the heat sink located therein, only a small force is required for holding/fixing in the holder. This can be applied for example by a clamping facility.

In a further advantageous embodiment of the invention the switching element has a semiconductor switch, wherein the semiconductor switch has precisely one semiconductor component chip. The semiconductor component chip is the active part of a semiconductor. It comprises a semiconductor material, which guides the current through the semiconductor switch. Semiconductor switches can in general comprise a number of semiconductor element chips, in order to obtain a correspondingly high current-carrying capacity. The switching element has a semiconductor switch and a diode arranged antiparallel thereto, so that a current through the switching element flows in one direction of flow through the semiconductor switch, provided said switch is conductive, and flows in the opposite direction of flow through the diode. To increase the performance of the switching elements, the semiconductor elements are fabricated from a number of parallel semiconductor component chips. The current-carrying capacity and thus the power of the switching element are increased by this. In respect of a good scalability of power converters that are constructed from phase modules, it has proved sensible for the semiconductor switch to have precisely one semiconductor component chip. This can already also include a diode function. As an alternative it is possible to realize the diode function of the switching element through a further semiconductor component chip arranged in parallel. With just one semiconductor component chip the switching element has a current-carrying capacity in the range of 100 A to 200 A. A phase module that has semiconductor switches and diodes in an arrangement as a half-bridge thus has a performance in the range of 20 kW to 35 kW.

In the realization of the semiconductor switch with precisely one semiconductor component chip the operation of the switching element is especially efficient since, on account of the absence of parallel switching of semiconductor component chips, there is no uneven distribution of the current to the semiconductor component chip. The utilization of the semiconductor component chip is therefore especially high and the power loss arising is comparatively low so that, with the non-detachable connection to the heat sink, an especially small and lightweight heat sink can be used. The share of the weight of the heat sink in the overall weight of the phase module is especially small in this case. Over and above this the performance of the switching element is suitable in particular for producing modular power converters in a performance range from 70 kW to 1 MW.

In a further advantageous embodiment of the invention the switching module has two switching elements, which are arranged in a series circuit. A half bridge can be realized in a simple manner with these two switching elements. This phase module has three electrical terminals, wherein two are provided for connection to DC link circuit capacitor (DC voltage-side terminals) and one terminal forms the phase terminal, also called the load terminal. With these terminals, either only with one or with more of these terminals, the phase module is able to be adequately fastened to busbars for example, so that no further mechanical fastenings are necessary.

A complete half bridge unit is thus produced by integration of heat sink and semiconductor module. In this case there is no longer any classically accessible interface between module and heat sink. The carrier substrate is connected directly to the heat sink (liquid and also air) by soldering, sintering for example. The phase module including heat sink forms a complete unit, which even in the event of replacement, are not separated from one another. Only entire phase modules are replaced in the event of a fault. Ideally the heat sink is precisely as large as (or only slightly larger than) the substrate itself. The cooling can be undertaken using various principles, e.g. air cooling and liquid cooling. Likewise additional elements can be employed for thermal management such as for example heat spreaders and heat pipes.

In a further advantageous embodiment of the invention a connection point of the two switching elements arranged in series is connected to a further switching element, wherein, by means of the further switching element, a current is able to be guided and switched in both directions of flow by the further switching element. With this arrangement a 3-point power converter is able to be produced in a simple manner and with just a few semiconductors. With this a more precise simulation of a desired output voltage is possible as a result of higher switching frequency and the additional voltage stage. The phase module thus represents a half bridge for a 3-point power converter.

In a further advantageous embodiment of the invention the phase module has a driver and/or a power output stage, in particular a linear final stage, for activating the switching element. The driver or the power output stage, in particular a linear final stage, likewise has losses, which must be dissipated in the form of heat. If the driver or the power output stage is already integrated into the phase module, the heat is able to be dissipated with the available heat sink. A further heat sink for cooling the power output stage, for which in some cases there is the expense of providing the cooling air or the cooling water, can be omitted.

In this case the driver or the power output stage is integrated on the substrate of the power semiconductor, preferably designed as a linear final stage. This is advantageous for the flexible use of the phase module in different areas of application. In such cases it is advantageous to use the same contacting technology as for the power semiconductors (sintering, soldering, bonding etc.).

Over and above this the integration of the driver for the power output stage reduces the inductance of the activation path. Through this the electrical time constants are reduced and the controllability of the semiconductor, above all during the switching process (e.g. in the linear area) is greatly improved in some cases.

Despite the high degree of integration, the phase module, by contrast with designs with fixed, integrated gate resistors, is able to be used flexibly, since for example the switching behavior can be adapted to the application case via the final stage. This applies in particular to a linear final stage. This enables the switching behavior to be adapted to the corresponding application case in an especially simple manner for the power converter that is equipped with this type of phase modules.

In a further advantageous embodiment of the invention the phase module has a measurement sensor system. It has proved advantageous, in particular for parallel connection of phase modules, to determine the current through the phase module, in order to be able to recognize an uneven distribution of currents to phase modules arranged in parallel. It is thus possible, by suitable activation of the phase semiconductors, to counteract an incorrect distribution and to achieve an even distribution to the parallel phase modules. A measurement of the phase current can be integrated into the phase module by means of shunt, Hall, GMR. Further parts of the sensor system for voltage detection susceptible to losses, such as a voltage divider for example, can likewise be integrated into the phase module with good heat conductance to the heat sink. Since the precision of these measuring facilities increases with higher losses, higher losses can be accepted because of the good thermal coupling and a more precise measured value determination can be achieved. The additional components are preferably integrated on the same substrate of the power semiconductor and without a separate component housing. Likewise it is advantageous to use the same contacting technology as for the power semiconductors (sintering, soldering, bonding etc.). In such cases the voltage divider can be a pure resistive design or a resistive-capacitive design.

By integrating the elements susceptible to losses onto the substrate, these are connected to the cooling in a manner providing good thermal conductance. This enables the voltage divider for the voltage measurement to be designed with lower resistance for example. Likewise the sensor system is protected by the encapsulation (or corresponding material) of the semiconductor from contamination and moisture and is thus more robust as regards environmental influences. Thus encapsulation additionally enables the air and creepage gaps on the components themselves to be reduced and the packing density to be increased accordingly. In some cases an additional housing can be dispensed with (e.g. SMD housing).

The integration of the current measurement into the phase module makes it possible in a simple manner, with a parallel connection of a number of phase modules for a phase, to regulate the division of current to the individual phase modules of the power converter phase. Through corresponding activation signals, for example by delaying of activation signals, it is possible to influence the division of the current such that all phase modules of a power converter phase have a current of the same size flowing through them. This enables the power converter to be utilized in the best possible way in relation to its performance.

In a further advantageous embodiment of the invention the power converter has a plurality of phase modules, wherein the phase modules are arranged in a parallel circuit. Modular-design power converters can be produced with the aid of the phase module. When switching elements with a cut-off voltage ranging from 1200V to 1700V and beyond are used, 2-point power converters in a performance range from around 70 kW to 1 MW can be produced for example. What these power converters have in common is that these have the same phase modules. The scaling is undertaken by the number of phase modules arranged in parallel. It is precisely for manufacturers of power converters that the use of as many identical parts as possible in the power converter is of great importance. This enables competitive advantages to be obtained as a result of higher volume. Moreover the stocking of spare parts can be realized at low cost because of fewer different parts. This applies in particular to phase modules, since these have semiconductor switches in the form of power semiconductors, which have a great effect on the costs of a power converter. Three of the phase modules form the smallest modular unit of a three-phase power converter. These can then be arranged in a frame construction of the power converter for example.

In a further advantageous embodiment of the invention the phase module has at least one electrical terminal and is fastened in the power converter by means of the at least one electrical terminal. The good thermal coupling of the power semiconductor to the heat sink of the phase module enables the structure of the phase module to be light enough for the phase module to be fastened mechanically to the electrical terminals in the power converter. Busbars made of copper, which are used at the same time for the electrical connection of the phase modules, are especially suitable for this purpose. The cross-sectional surface of the busbars is determined inter alia by the performance of the phase module or of the phase modules connected thereto. It has been shown that these are suitable, through the relatively lightweight structure of the phase modules, for taking up the entire weight of the phase modules as well as additional forces as a result of accelerations, shocks or vibrations.

The mechanical fastening is especially advantageous for phase modules that are designed as a half bridge for a 2-point power converter. Here two DC voltage terminals are present for contacting with a DC link circuit capacitor, which are preferably of a low-inductance design and at the same time can serve as a mechanical fastening for the phase module. In the design as a 3-point power converter, three DC voltage terminals are even available for contacting with DC link circuit capacitors, which likewise are preferably low-inductance and are therefore in contact with the busbar. This electrical contact, in addition to current conductance, can also take on the task of fastening the module in the converter for a 3-point power converter.

BRIEF DESCRIPTION OF THE DRAWING

The invention will be described and explained in greater detail below on the basis of the exemplary embodiments shown in the figures, in which.

DETAILED DESCRIPTION OF PREFERRED EMBODIMENTS

Figure 1:
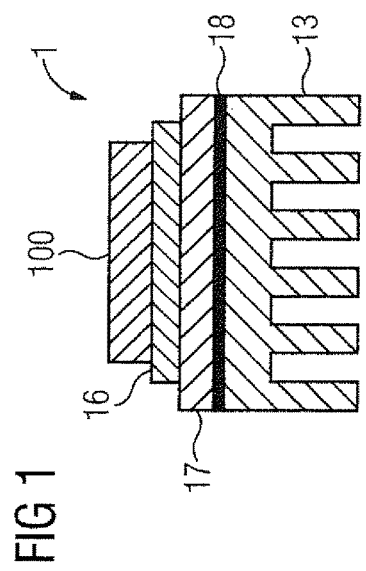
FIG. 1, FIG. 2 show the cross-section through a phase module.

FIG. 1 shows the cross-section through a phase module 1. Here the semiconductor component chip 100 is connected to the heat sink 13. The copper layer 16 is used for electrical contacting of the semiconductor component chip 100. A second contacting of the semiconductor component chip 100 is not shown in this figure for the sake of simplicity. The copper layer 16 is applied in this case to a substrate 18, also called a carrier layer. This forms the switching element 10. With the aid of a connection layer, such as solder or a layer of adhesive for example, a non-detachable connection to the heat sink 13 is produced.

The phase module 1 shown here, in the simple form of embodiment shown here, comprises precisely one semiconductor component chip 100. In this case this semiconductor component chip 100 can include both the function of the semiconductor switch 11 and also the function of the diode 12. As an alternative it is possible to realize these two functions by a separate semiconductor component chip 100.

Figure 2:
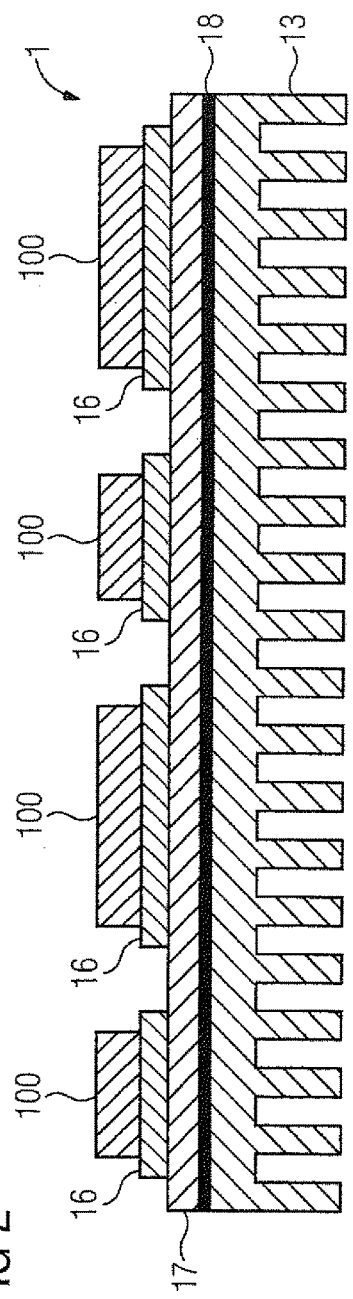

FIG. 2 shows the cross-section through a further phase module 1. To avoid repetitions, the reader is referred to the description for FIG. 1 as well as to the reference characters given there. This phase module 1 has four semiconductor component chips 100, which differ in their size. In this figure the larger semiconductor component chips 100 produce the function of the semiconductor switch 11 and the smaller semiconductor component chips 100 produce the function of the diode 12. The copper layers 16 are used for electrical contacting. Here too the second contacting of the individual semiconductor component chips 100 is not shown. The individual copper layers 16 are again applied to the substrate 18. The connection layer 18 is used to create a non-detachable connection between the switching elements 10 and the heat sink 13. The connection layer 18 can involve solder or an adhesive layer for example. With these four semiconductor component chips 100 a half bridge for a 2-point power converter can be constructed in a simple manner.

Figure 3:
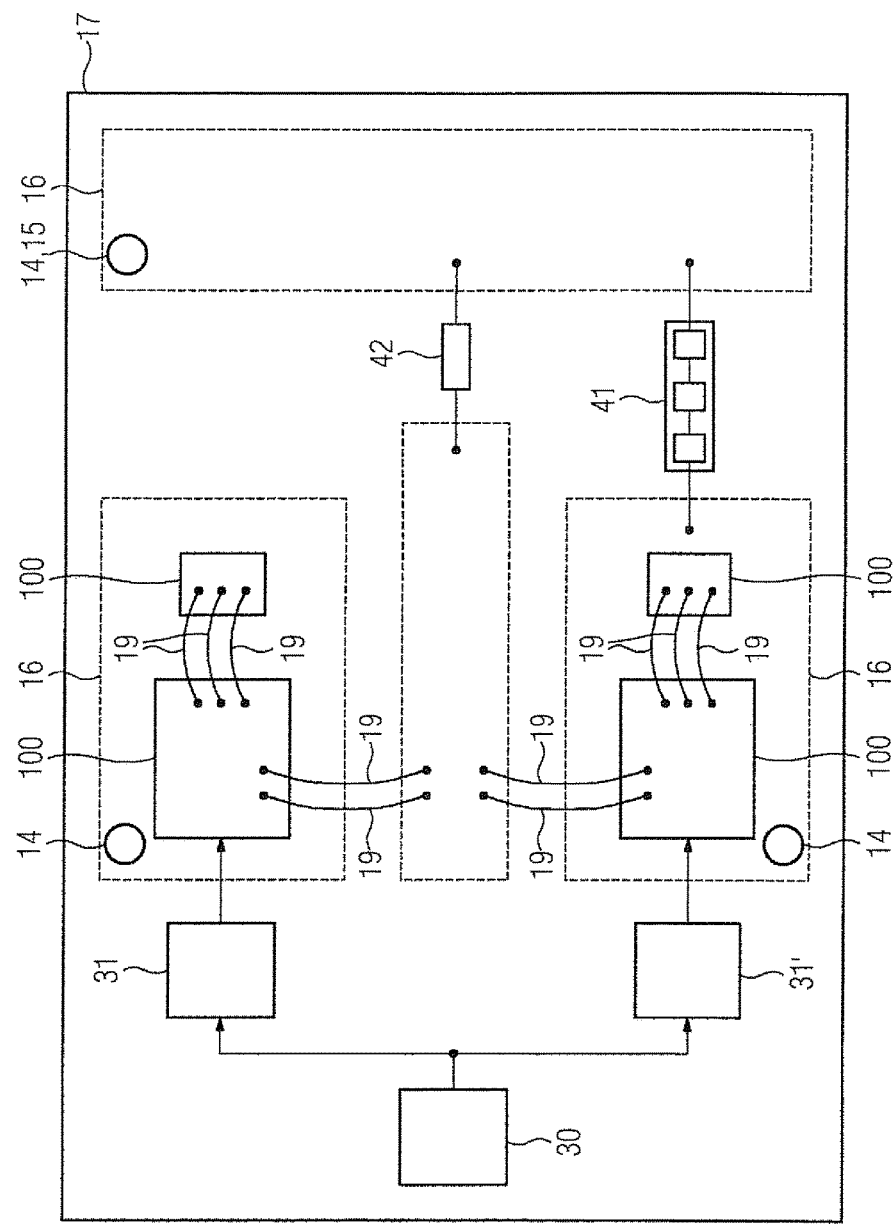
FIG. 3 shows the internal structure of a phase module.

FIG. 3 shows the internal structure of a phase module 1 in a view from above. The substrate 17, which carries the individual components of the phase module 1, can be seen here. The power semiconductor elements in this case are the semiconductor component chips 100. These are arranged on copper layers 16. The second contacting, for example between the semiconductor component chips 100 or between semiconductor component chip 100 and copper layer 16, is made by means of bond wire 19. The copper layers 16, to which the semiconductor component chip 100 is attached, additionally have an electrical terminal 14. The load terminal 15 is likewise connected to a copper layer 16. A shunt 42 is arranged in the electrical connection between semiconductor component chip 100 and load terminal 15, with which the output current is able to be determined. The voltage divider 41 serves to determine the voltage at the load terminal 15. This is arranged between the copper layers 16 of the load terminal 15 and a semiconductor component chip 100. The power output stages 31 are used for activation of the semiconductor component chips 100 of the semiconductor switch 10. These provide a control voltage (gate voltage) required for operation at the control terminal of the switching element 10. With the aid of a linear power output stage 31 it is possible to design the voltage at the control terminal to be adjustable. This enables the switching behavior of the switching element 10 to be adapted to the application case. The power output stages 31 obtain from the driver 30 the information as to which switching state the switching elements 10 are to assume. It is likewise possible to transmit a desired voltage for the control terminal to the power output stage 31. In this case the driver 30 contains the intelligence that is required for the activation of the semiconductor switch 11, such as a voltage supervision system for example.

Figure 4:
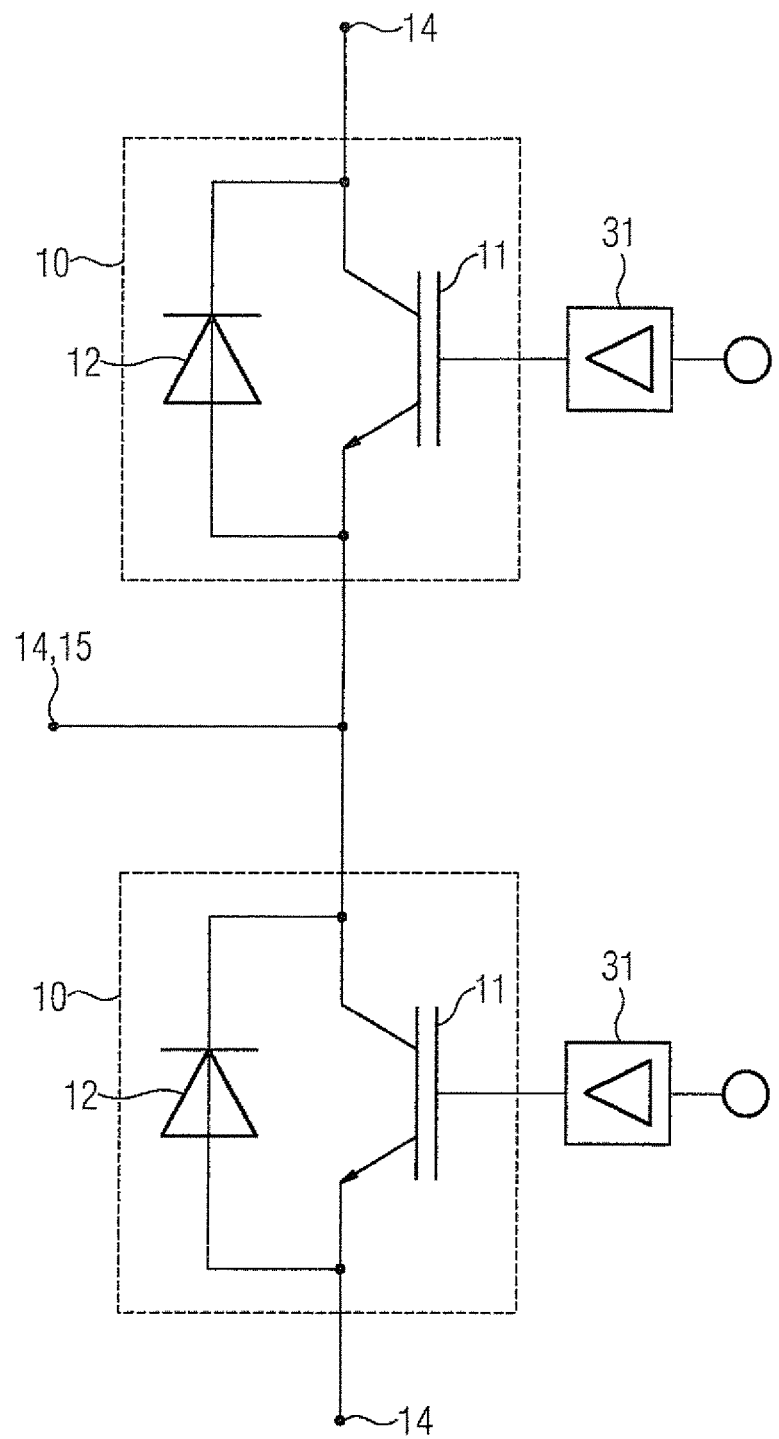
FIG. 4, FIG. 5 show the structure of a half bridge.

FIG. 4 shows the structure of a phase module 1 with two switching elements 10, which are arranged in a series circuit and thereby form a half bridge. The connecting point between the two switching elements 10 forms the load terminal 15. The remaining electrical terminals 14 form the connection to the DC link circuit. The switching elements 10 comprise a semiconductor switch 11 and a diode 12 arranged antiparallel thereto. The semiconductor switch 11 is activated via the power output stage 31 and put into its operating states "conduct" or "block". A 2-point power converter can be realized in a simple manner with this form of embodiment.

Figure 5:
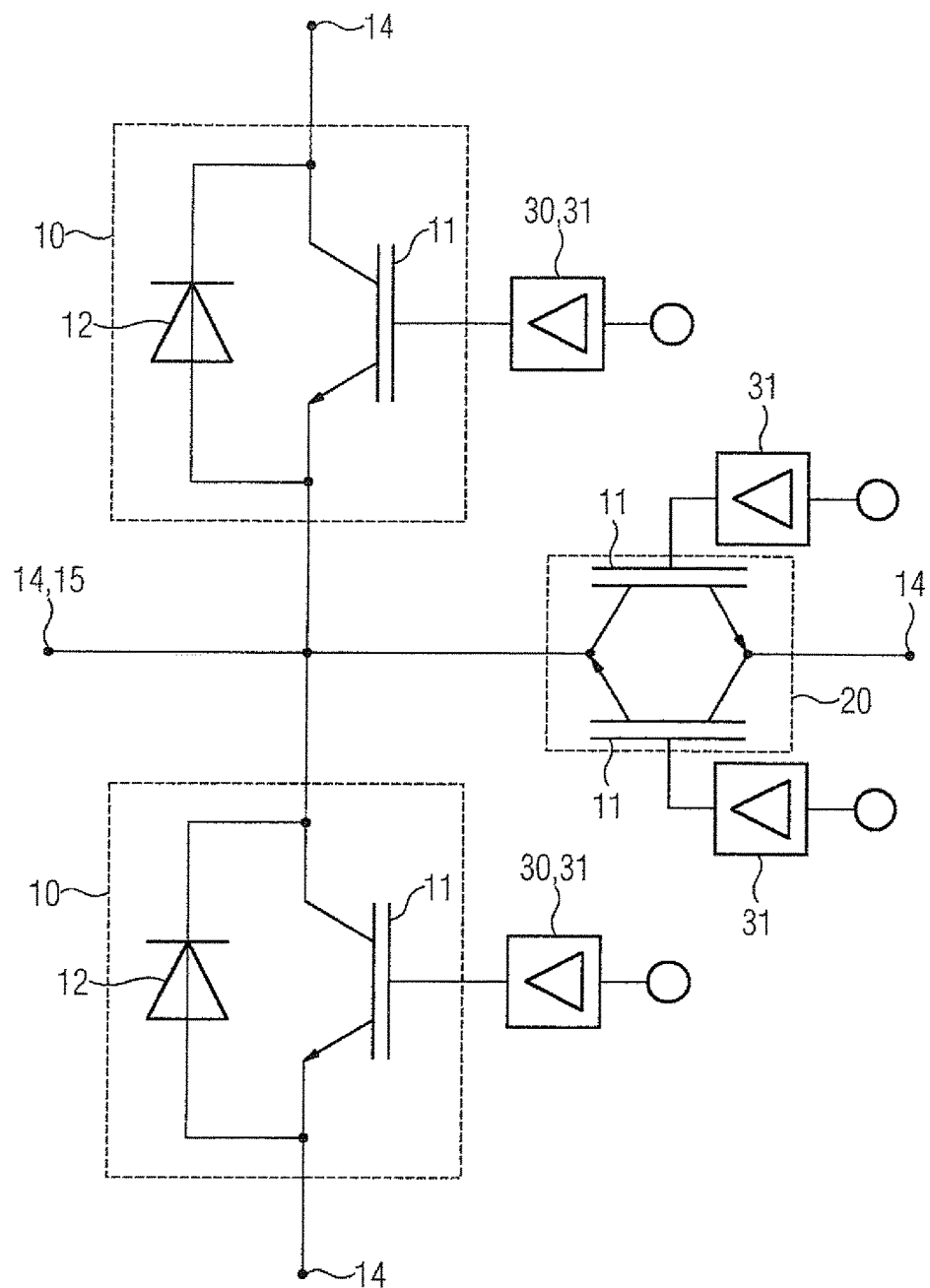

FIG. 5 shows the structure of another phase module 1 for producing a 3-point power converter. To avoid repetitions, the reader is referred to the description for FIG. 4 as well as to the reference characters given there. In addition to the construction of a half bridge for 2-point power converters, a further switching element 20 is added at the connecting point between the two switching elements 10. Three electrical terminals 14 are now available on the DC voltage side. The load terminal 15 can now assume one of the three potentials of the DC voltage side. The semiconductor switches 11 of the further switching module 20 are also activated via power output stages 31.

Figure 6:
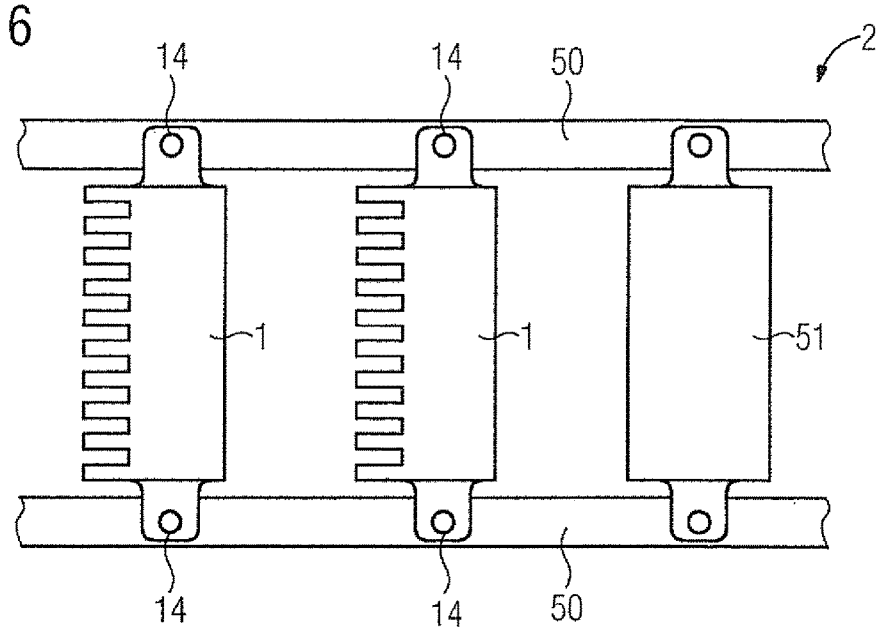
FIG. 6 shows how the phase modules are fastened in the power converter.

FIG. 6 shows a power converter 2 with two phase modules 1 and a capacitor 51. The electrical terminals 14 are connected electrically to the capacitor 51 via busbars 50. In this case the busbars 50 are fastened to the power converter 2. The mechanical fastening of the phase modules is done via the electrical terminals 14. An additional mechanical fastening of the phase modules 1 is not required.

The power converter 2 shown here involves a single-phase power converter 2. To realize a three-phase power converter 2, a further phase module 1, i.e. three phase modules 1 in total, is required. In order to increase the performance of a power converter 2, further phase modules 1 will be arranged in addition in the power converter 2. In this case the load terminals 15, not shown here, of one phase will likewise be connected to one another.

Figure 7:
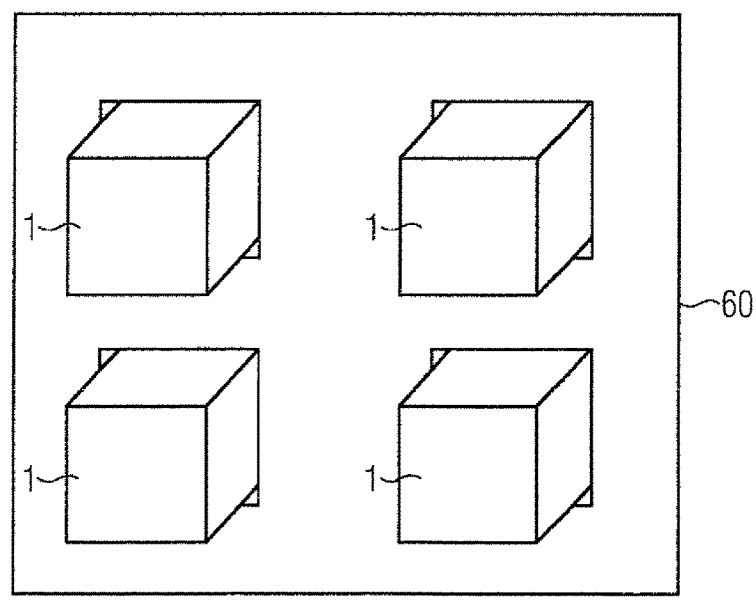
FIG. 7 shows a retaining plate for phase modules.

A further option for arranging phase modules 1 in a power converter 2 is shown in FIG. 7. In this figure the individual phase modules 1 are pushed into a retaining plate 60. The retaining plate 60 in this case has template-like openings, in which the phase modules 1 are arranged. Because of the light weight of the phase modules 1, these can be held in the retaining plate 60 in a simple manner, for example by a clamping connection.

Although the invention has been illustrated and described in greater detail by the preferred exemplary embodiments, the invention is not solely restricted to the disclosed examples and other variations can be derived herefrom by the person skilled in the art, without departing from the scope of protection of the invention.

In summary the invention relates to a phase module for a power converter, having at least one switching element and a heat sink. To improve the cooling characteristic of a phase module it is proposed that the switching element is connected to the heat sink, wherein the connection between switching element and heat sink is a non-detachable connection. The invention further relates to a power converter with at least one phase module of this type and also to a method for producing a phase module of this type, wherein to produce a connection between the switching element and the heat sink, the switching element is soldered, sintered or glued onto the heat sink.

The invention claimed is:

1. A power converter, comprising:
    a heat sink;
    a phase module including a switching element with a cut-off voltage ranging from 1200V to 1700V, said switching element connected to the heat sink via a non-detachable connection through soldering, sintering or gluing;
    a busbar; and
    an electrical terminal of the phase module configured to fasten the phase module to the busbar.

2. The power converter of claim 1, further comprising a plurality of said phase module arranged in a parallel circuit.

3. The power converter of claim 1, wherein the heat sink is defined by a weight which amounts to less than 50% of a weight of the phase module as a whole, including heat sink.

4. A method for producing a power converter, comprising:
providing a phase module having a switching element with a cut-off voltage ranging from 1200V to 1700V;
establishing a non-detachable connection between the switching element and a heat sink by soldering, sintering or gluing the switching element onto the heat sink; and
fastening the phase module to a busbar by way of an electrical terminal of the phase module.

5. The method of claim 4, further comprising evenly heating a contact surface of both the switching element and the heat sink during soldering or sintering.

* * * * *